United States Patent
Chong et al.

(10) Patent No.: US 12,512,437 B2
(45) Date of Patent: Dec. 30, 2025

(54) SEMICONDUCTOR DEVICE ASSEMBLIES WITH BALANCED WIRES, AND ASSOCIATED METHODS

(71) Applicant: Micron Technology, Inc., Boise, ID (US)

(72) Inventors: Chin Hui Chong, Singapore (SG); Hong Wan Ng, Singapore (SG); Suresh K. Upadhyayula, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 583 days.

(21) Appl. No.: 17/898,368

(22) Filed: Aug. 29, 2022

(65) Prior Publication Data

US 2024/0071979 A1     Feb. 29, 2024

(51) Int. Cl.
*H01L 23/00* (2006.01)

(52) U.S. Cl.
CPC .............. *H01L 24/48* (2013.01); *H01L 24/06* (2013.01); *H01L 24/45* (2013.01); *H01L 24/85* (2013.01); *H01L 2224/04042* (2013.01); *H01L 2224/06131* (2013.01); *H01L 2224/45144* (2013.01); *H01L 2224/48091* (2013.01); *H01L 2224/48227* (2013.01); *H01L 2224/85* (2013.01)

(58) Field of Classification Search
None
See application file for complete search history.

(56) References Cited

U.S. PATENT DOCUMENTS

2003/0057550 A1 *  3/2003  Zhao ................. H01L 23/49833
                                                                    257/734

* cited by examiner

*Primary Examiner* — Yu-Hsi D Sun
(74) *Attorney, Agent, or Firm* — Dorsey & Whitney LLP

(57) ABSTRACT

An assembly comprising a substrate with a first and second bond pad at a top surface; and a semiconductor die with a lower surface coupled to the top surface, an upper surface with a third and fourth bond pad thereat, and a side surface perpendicular to the upper and lower surfaces. The first bond pad can be a first distance, the second bond pad can be a second distance, the third bond pad can be a third distance, and the fourth bond pad can be a fourth distance, respectively, from the side surface. The first and third distances summed can be the same as the second and fourth distances summed. A first wire can extend between the first and third bond pads, and a second wire can extend between the second and fourth bond pads.

20 Claims, 4 Drawing Sheets

300

302
Provide a substrate having a top surface at which are disposed a first and a second bond pad.

304
Couple a lower surface of a semiconductor die to the top surface of the substrate, the semiconductor die including an upper surface, and further including a third and a fourth bond pad at the upper surface

306
Form a first wire extending from the first bond pad to the third bond pad.

308
Form a second wire extending from the second bond pad to the fourth bond pad, and having a length substantially the same as a length of the first wire.

*FIG. 3*

SEMICONDUCTOR DEVICE ASSEMBLIES WITH BALANCED WIRES, AND ASSOCIATED METHODS

TECHNICAL FIELD

The present technology is generally related to semiconductor device assemblies. In particular, the present technology relates to semiconductor device assemblies with balanced wires between assembly semiconductor devices and/or dies and an assembly substrate.

BACKGROUND

Microelectronic devices, such as memory devices and microprocessors, and other electronics typically include one or more semiconductor devices and/or components attached to a substrate and encased in a protective covering. The devices and/or components include at least one functional feature, such as memory cells, processor circuits, or interconnecting circuitry, etc. Each device and/or component commonly includes an array of small bond pads electrically coupled to the functional features therein for interconnection with other devices and/or components. For example, for interconnection from the devices and/or components to the substrate.

Manufacturers are under increasing pressure to reduce the space occupied by these devices and components while simultaneously increasing the capacity and/or speed of operation for the resulting semiconductor device assemblies. One method manufacturers use to improve operating speed is increasing device signaling integrity, thereby allowing high-speed signal transmission without a corresponding decrease is signal quality. Current devices and components, however, have reached signal integrity limits. For example, some limitations are imposed by physical and electrical properties of the materials these components reaching their operating limits.

BRIEF DESCRIPTION OF THE DRAWINGS

FIG. 3 is a flow diagram illustrating a process for producing a semiconductor device assembly, in accordance with some embodiments of the present technology.

Figure 1:
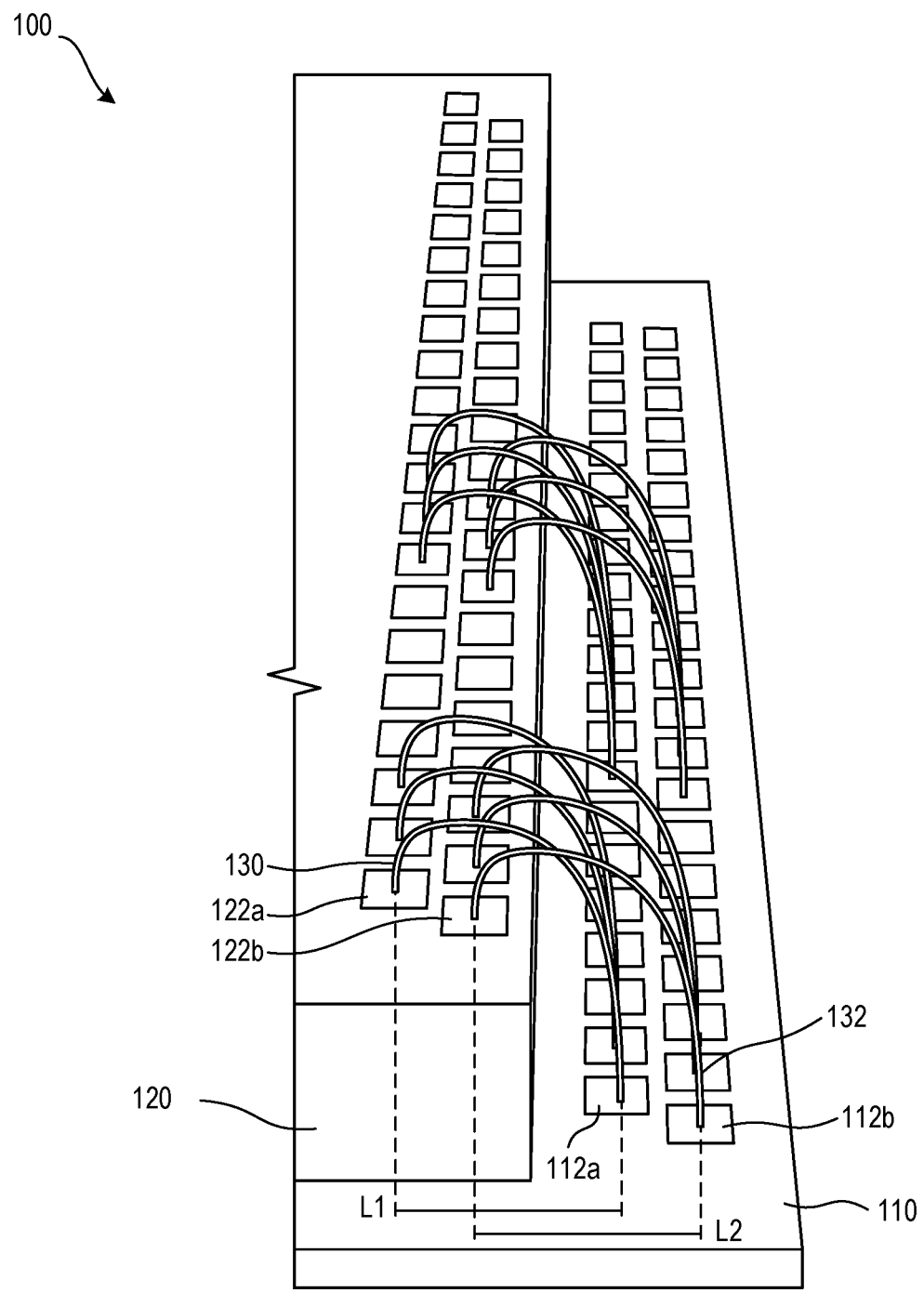
FIG. 1 is a perspective view of selected components from a semiconductor device assembly, configured in accordance with some embodiments of the present technology.

The drawings have not necessarily been drawn to scale. Similarly, some components or operations can be separated into different components or combined into a single assembly in some implementations of the present technology. While the technology is amenable to various modifications and alternative forms, specific implementations have been shown by way of example in the drawings and are described in detail below.

DETAILED DESCRIPTION

Traditionally, semiconductor device assemblies can include semiconductor devices and/or dies bonded to a surface of a substrate, or an assembly or package device. In some implementations, the devices and/or dies and the substrate can electrically communicate through wire bonds extending between bond pads on the top of the devices and/or dies and bond pads on the surface of the substrate. These bond pads are implemented in rows (e.g., an inner and an outer row) on the substrate surface near the devices, and on the top of the devices near corresponding substrate bond pads. Short wire bonds extend between inner bond pads of the substrate and inner bond pads of the device; and long wire bonds extend between outer bond pads of the substrate and outer bond pads of the device.

Given the scale of these assemblies (e.g., micrometers), these variations in length (e.g., short versus long wire bonds) and, sometimes, variations in composition can translate to varied electric transmission speeds in different wire bonds. This variation can lead to diminished signal integrity, as well as device and/or assembly malfunctions as some operations of the assemblies may lag behind other. In particular, this variation can lead to serious operating problems when wires are used for transmitting balanced signals. Further, manufacturers may be required (i) to compensate for these variations by modifying unrelated elements of the assembly (e.g., other substrate/assembly traces/design elements), and (ii) closely monitor wire manufacturing to ensure wire bonds do not touch; both requirements increasing costs related to engineering and manufacturing, and reducing assembly efficiency, among others.

The assemblies and methods of the present technology relate to semiconductor device assemblies with balanced bond wires (e.g., bond wires having the same lengths) extending between assembly semiconductor devices and/or dies and an assembly substrate. Further, the present technology relates to assembles with balanced traces (e.g., within an assembly and/or device substrate). For example, semiconductor devices and assembly substrates of the present technology can each include rows (e.g., two; an inner and an outer row) of staggered bond pads. Wire bonds can extend from the bond pads of the inner row of the substrate to the outer row of the device (e.g., first wire bonds); and from the bond pads of the outer row of the substrate to the inner row of the device (e.g., second wire bonds. Therefore, from end-to-end, a first wire bond and a second wire bond (e.g., a wire bond pair) can each have the same—or substantially the same—length. The wires of the wire bond pair are therefore balanced, (e.g., a balanced wire bond pair).

The balanced wire pair can reduce or eliminate the above-noted limitations of non-balanced wire bonds. For example, because the lengths of balanced wire bonds are the same, or substantially the same, electric (e.g., electricity, signal) transmission speeds can be identical or nearly identical. Identical electric transmission speeds can improve signal integrity, improving machine and/or assembly timing, especially as assembly operating speeds increase and timing windows decrease. Further, manufacturers are less constrained when designing other elements of the assembly to compensate for signaling lag or mismatch. For example, trace lengths within the substrate can have greater flexibility in their mapping. Furthermore, manufacturability of the assembly can increase and chances for wire bond touching can decrease as all wires are aligned as opposed to potentially overlapping.

Some embodiments of the present technology, such as a semiconductor device assembly, can include a substrate with a top surface, and a first and a second bond pad at the top surface. The assembly can further include a semiconductor die with a lower surface coupled to the top surface of the substrate. The die can further include an upper surface, a side surface—the side surface perpendicular to the lower and the upper surfaces—, and a third and a fourth bond pad at the upper surface.

In some embodiments, regarding the substrate, the first bond pad can be a first distance from the side surface, and the second bond pad can be a second distance from the side surface, different than the first distance. Regarding the die, the third bond pad can be a third distance from the side surface, and the fourth bond pad can be a fourth distance from the side surface, different than the third distance. A sum of the first distance and the third distance can be substantially the same as a sum of the second distance and the fourth distance. Further, a first wire can extend from the first bond pad to the second bond pad, and a second wire can extend from the second bond pad to the fourth bond pad.

In some embodiments, regarding the substrate, the first bond pad can be closer to the side surface than the second bond pad. Regarding the die, the third bond pad can be further from the side surface than the fourth bond pad. Further, a first wire can extend from the first bond pad to the second bond pad, a second wire can extend from the second bond pad to the fourth bond pad, and a length of the first wire can be substantially the same as a length of the second wire.

The assemblies of these embodiments can be manufactured by providing the substrate having the top surface with the first and the second bond pads thereat. Then, the die with the third and the fourth bond pads at the upper surface can be coupled to the substrate. The die can be coupled to the substrate with the first bond pad closer to the side surface than the second bond pad, and with the third bond pad further from the side surface than the fourth bond pad. A first wire can be formed extending from the first bond pad to the third bond pad, and a second wire can be formed extending from the second bond pad to the fourth bond pad, with a length of the second wire substantially the same as a length of the first wire.

For ease of reference, the semiconductor device and other components are sometimes described herein with reference to top, bottom, left, right, lateral, vertical, uppermost, lowermost, or other similar directional terms relative to the spatial orientation of the embodiments described and/or shown in the figures. The semiconductor devices described herein and modifications thereof can be moved to and/or used in different spatial orientations without changing the structure and/or function of the disclosed embodiments of the present technology.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. The terms "comprising," "including," "having," and "with" are used throughout to mean including at least the recited feature(s) such that any greater number of the same features and/or additional types of other features are not precluded. Similarly, use of the word "some" is defined to mean "at least one" of the relevant features and/or elements. Further, the term "substantially" as used herein regarding "substantially the same as" means the relevant features or values are the same or within 1%, 2%, 5%, or 10% of one another.

FIG. 1 is a perspective view of selected components from a semiconductor device assembly 100 having balanced wires 130, 132 directly electrically coupling a semiconductor device 120 to a semiconductor assembly substrate 110, configured in accordance with some embodiments of the present technology. The assembly 100 can include one or more devices 120 (e.g., semiconductor dies, dies) at a top surface of the substrate 110. The substrate 110 can include a plurality of inner substrate bond pads 112a (e.g., bond fingers) defining a substrate inner bond pad row, and a plurality of outer substrate bond pads 112b defining a substrate outer bond pad row (collectively, the substrate bond pads 112). The substrate bond pads 112 can be at the top surface of the substrate 110 and adjacent to (e.g., laterally offset from) a side (e.g., side surface) of one of the devices 120.

One or more of the devices 120 can each include a plurality of inner device bond pads 122b defining a device inner bond pad row, and a plurality of outer device bond pads 122a defining a device outer bond pad row (collectively, the device bond pads 122). The device bond pads 122 can be at a top surface of the device 120, and can be adjacent to (i) the side of the device 120, and (ii) the substrate bond pads 112. The assembly 100 can further include pairs of balanced wires, such as a first wire 130 and a second wire 132, bonded between the substrate bond pads 112 and the device bond pads 122.

A lateral (e.g., along the surface of the substrate 110 or device 120) or a direct/absolute distance between the inner substrate bond pads 112a and the outer device bond pads 122a L1 (or a distance between wire bonding locations (e.g., where the wires are bonded to the bond pads)) can be the same as a lateral distance between the outer substrate bond pads 112b and the inner device bond pads 122b L2. Similarly, the lengths (e.g., along the curvature of the wire, a straightened length) of each wire (e.g., the first and second wires 130, 132) of the balanced wire pair can be the same. In some embodiments, the assembly 100 can further include additional individual wire bonds of the same length and/or additional balanced wire pairs. Further, in some embodiments, the assembly 100 can include additional wire bonds of varied lengths.

As discussed above, including the balanced wire pairs in the assembly 100 can provide many benefits. For example, balanced wire pairs can reduce or eliminate variances in electric transmission speeds, thereby improving assembly signaling integrity and assembly timing. Further, balanced wire pairs can reduce manufacturers design constraints required to compensate for signaling issues and manufacturability.

The substrate 110 can be a package-level substrate upon which other semiconductor devices are carried by (e.g., coupled to, bonded to, attached to, adhered to), such as a printed circuit board (PCB), an interposer, the devices 120, or another semiconductor device having functional features therein. As illustrated, the substrate 110 is a PCB. The substrate bond pads 112 can be in electric communication with one or more functional features within the substrate 110, allowing communication (e.g., electric communication) between these functional features—or the substrate 110, generally—and elements external to the substrate 110.

The substrate bond pads 112 can be aligned in two rows. One or more (or all) of the inner substrate bond pads 112a can be aligned in the inner (e.g., first/second, left/right, top/bottom) row parallel and/or adjacent to (e.g., close to, next to) and, in some embodiments, offset from the side of the device 120. One or more (or all) of the outer substrate bond pads 112b can be aligned in the outer (e.g., second/first, right/left, bottom/top) row parallel to and distal from (e.g., far from, away from) the side of the device 120. In some embodiments, a gap may be between the inner and the outer substrate bond pads 112. This gap may improve manufacturability by providing operating room during a wire forming operation, and/or may provide additional space within the substrate 110 for wire traces. In some embodiments, the substrate 110 can include additional (e.g., 3, 4, 5, etc. total) rows of bond pads spaced progressively further from the side of the device 120. Additional bond pad rows can allow for additional interconnections between the substrate 110 and the device 120 to interconnect more functional features thereof.

Regarding the substrate 110 bond pad rows, the inner substrate bond pads 112a can be aligned in the inner row with an inner edge (e.g., left/right, top/bottom edge; toward the device 120), a center, or another structural feature of one or more of the inner substrate bond pads 112a offset from the side of the device 120 a first distance. The outer substrate bond pads 112b can be aligned in the outer row, with an inner edge, a center, or another structural feature of one or more of the outer substrate bond pads 112b offset from the side of the device 120 (or a structural feature of the inner substrate bond pads 112a) a second distance.

In some embodiments, each of the inner substrate bond pads 112a—the inner bond pad row—can be offset from the side of the device 120 by substantially the same distance (e.g., the first distance). Additionally, each of the outer substrate bond pads 112b—the outer bond pad row—can be offset from the side of the device 120 (or from a structural feature of the inner substrate bond pads 112a) by substantially the same distance (e.g., the second distance). In some embodiments, the first distance can be between 50 μm and 500 μm, inclusive, and the second distance can be between 100 and 800 μm, inclusive, or any specific value outside these ranges. Aligning the inner and/or outer bond pad rows closer to, or further from, the device 120 (e.g., having the first and/or second distances within these ranges) can allow the present technology to be implemented in different assemblies, thereby improving signaling across multiple semiconductor assembly applications.

The outer substrate bond pads 112b can be misaligned (e.g., staggered, stepped, offset) with (e.g., relative to) the inner substrate bond pads 112a along the length of the inner and outer rows. For example, edges of the outer substrate bond pads 112b may not align with edges of the inner substrate bond pads 112a. In some embodiments, the centerline of one or more of the outer substrate bond pads 112b can align with a gap between two inner substrate bond pads 112a. In some embodiments, the centerline of one or more of the outer substrate bond pads 112b can instead align with an edge of, or overlap with the body of, one of the inner substrate bond pads 112a. Misaligning the outer substrate bond pads 112b with the inner substrate bond pads 112a can ensure a gap between the first and the second wires 130, 132, reducing or eliminating the chances of the wires 130, 132 touching.

As illustrated, the inner row includes twenty-one inner substrate bond pads 112a, and the outer row includes twenty-one outer substrate bond pads 112b. The inner edges of the inner substrate bond pads 112a are separated from the side of the device 120 by (e.g., the first distance is equal to) about 200 and the inner edges of the outer substrate bond pads 122a are separated from the side of the device 120 by (e.g., the second distance is equal to) about 500 Additionally, the centerlines of the outer substrate bond pads 112b are centered within the gaps between the inner substrate bond pads 112a. In some embodiments, the substrate 110 can include fewer (e.g., 5, 10, etc.) or additional (e.g., 50, 100, 1000, etc. total) inner and/or outer substrate bond pads 112, or a number of bond pads outside or therebetween.

Each device 120 can be a memory and/or processing device, such as a memory die (e.g., a NAND die, a DRAM die, a NOR die, a PCM die, a FeRAM die, etc.), a graphics processing unit, a logic device, or any similar semiconductor device having functional features therein. The device bond pads 122 can be in communication (e.g., electric communication) with one or more functional features within the device 120, allowing communication between these functional features—or the device 120, generally—and elements external to the device 120.

Similar to the substrate bond pads 112, the device bond pads 122 can be aligned in two rows. One or more (or all) of the inner device bond pads 122b can be aligned in the inner row parallel and/or adjacent to and, in some embodiments, offset from the side of the device 120. One or more (or all) of the outer device bond pads 122a can be aligned in the outer row parallel to and distal from the side of the device 120. In some embodiments, a gap may be between the inner and the outer device bond pads 122. This gap may improve manufacturability by providing operating room during a wire forming operation, and/or may provide additional space within the device 120 for wire traces. In some embodiments, the device 120 can include additional (e.g., 3, 4, 5, etc. total) rows of bond pads spaced progressively further from the side of the device 120. Additional bond pad rows can allow for additional interconnections between the substrate 110 and the device 120 to interconnection more functional features thereof.

Regarding the device 120 bond pad rows, the inner device bond pads 122b can be aligned in the inner row, with an inner edge (e.g., right/left, bottom/top edge; toward the substrate bond pads 112), a center, or another structural feature of one or more of the inner device bond pads 122b offset from the side of the device 120 a third distance. Further, the outer device bond pads 122a can be aligned in the outer row, with an inner edge, a center, or another structural feature of one or more of the outer device bond pads 122a offset from the side of the device 120 (or a structural feature of the inner device bond pads 122b) a fourth distance.

In some embodiments, each of the outer device bond pads 122a—the outer bond pad row—can be offset from the side of the device 120 (or from a structure feature of the device bond pads 122b) by substantially the same distance (e.g., the third distance). Additionally, each of the inner device bond pads 122b—the inner bond pad row—can be offset from the side of the device 120, by substantially the same distance (e.g., the fourth distance). In some embodiments, the third distance can be between 100 μm and 800 μm, inclusive, and the fourth distance can be between 50 μm and 500 μm, inclusive, or any specific value outside these ranges. Aligning the inner and/or outer bond pad rows closer to, or further from, the side of the device 120 (e.g., having the third and/or fourth distances within these ranges) can allow the present technology to be implemented in different assemblies, thereby improving signaling across multiple semiconductor assembly applications.

Further, in some embodiments, the sum of the first and the third distances (e.g., the lateral distance L1) and the sum of the second and the fourth distances (e.g., the lateral distance L2) can be the same, or substantially the same. For example, the lateral distances of L1 and L2 can be between 150 μm and 1300 μm, inclusive, or any specific value outside these ranges.

The outer device bond pads 122a can be aligned with the inner substrate bond pads 112a (e.g., along the centerlines, the edges, or another structural feature thereof); and the inner device bond pads 122b can be aligned with the outer substrate bond pads 112b. Therefore, in some embodiments, like the substrate bond pads 112, the outer device bond pads 122a can be misaligned from the inner device bond pads 122b. Further, in some embodiments, the centerline of one or more of the outer device bond pads 122a can align with a gap between two inner device bond pads 122b; or the centerline of one or more of the outer device bond pads 122a can instead align with an edge of, or overlap with the body of, one of the inner device bond pads 122b. Misaligning the outer device bond pads 122a with the inner device bond pads 122b can ensure a gap between the first and the second wires 130, 132, reducing or eliminating the chances of the wires 130, 132 touching.

As illustrated, the outer row includes twenty-one outer device bond pads 122a, and the inner row includes twenty-one inner device bond pads 122b. The inner edges of the outer device bond pads 122a are separated from the side of the device 120 by (e.g., the third distance is equal to) about 100 and the inner edges of the device bond pads 122b are separated from the side of the device 120 by (e.g., the first distance is equal to) about 400 Additionally, the outer device bond pads 122a are centered with the inner substrate bond pads 112a, and the inner device bond pads 122b are centered with the outer substrate bond pads 112b. In some embodiments, the device 120 can include fewer (e.g., 5, 10, etc.) or additional (e.g., 50, 100, 1000, etc.) inner and/or outer device bond pads 122, or a number outside or therebetween.

Each balanced wire pair (e.g., the first wire 130 and the second wire 132) can extend between and electrically couple a corresponding pair of (i) the inner substrate bond pads 112a and the outer device bond pads 122a, and (ii) the outer substrate bond pads 112b and the inner device bond pads 122b. For example, the first wire 130 can extend from the inner substrate bond pad 112a to the outer device bond pad 122a, and the second wire 132 can extend from the outer substrate bond pad 112b to the inner device bond pad 122b. By electrically coupling corresponding substrate and device bond pads 112, 122, components within the substrate 110 and the device 120 can electrically communicate.

A first (or second) end of the first wire 130 and of the second wire 132 can be bonded (e.g., coupled, attached) to the inner substrate bond pad 112a and the outer substrate bond pad 112b, respectively. A second (or first) end of the first wire 130 and of the second wire 132 can be bonded to the outer device bond pad 122a and the inner device bond pad 122b, respectively. Further, a length (e.g., along the curvature of the wire, a straightened length) of the first wire 130 and the second wire 132 can be the same, or substantially the same. For example, a distance along the first wire 130 from the first end to the second end thereof can be the same as a distance along the second wire 132 from the first end to the second end thereof. The lengths of the first and the second wires 130, 132 can be between 200 μm and 2000 μm, inclusive, or any specific value outside this range.

Similarly, a cross-sectional area of the first wire 130 at any one point along the wire, or along the entirety of the wire, can be the same as, or substantially the same as, a corresponding cross-sectional area of the second wire 132. Accordingly, a mass of the first wire 130 can be the same as, or substantially the same as, a mass of the second wire 132 when the first and the second wires 130, 132 have the same or a similar material composition, among other similar physical wire characteristics.

The first end and/or the second end of the first wire 130 and/or of the second wire 132 can be centrally bonded on the corresponding substrate or device bond pad 112, 122. For example, the bond location on one of the substrate or device bond pads 112, 122 can align with a vertical and/or a horizontal centerline of the bond pad. In some embodiment, the first end and/or second end can instead be offset from the center toward one or more sides (e.g., diagonal) of the corresponding substrate or device bond pad 112, 122. In some embodiments, all bonds between the wires 130, 132 and the substrate or device bond pads 112, 122 of the inner and/or outer rows can be similarly positioned on the bond pads. For example, in embodiments with multiple balanced wire pairs, all bonds between the wires 132 and the outer substrate bond pads 112b can be centrally located on the corresponding outer substrate bond pad 112b. Aligned bonding between the wires 130, 132 and the substrate and device bond pads 112, 122 in the inner and outer bond pad rows can improve signaling integrity by ensuring the wire 130, 132 lengths are the same, or substantially the same, throughout the assembly 100.

In embodiments where the substrate 110 and the device 120 include one or more additional rows of bond pads, each pair of wires can be a set of wires (e.g., more than two). Each wire set can include a number of wires corresponding with the number of bond pad rows. For example, if the substrate 110 and the device 120 each include three bond pad rows, each wire set can include three wires (e.g., a first, a second, and a third wire). Further, in some embodiments where the substrate 110 and the device 120 include one or more additional bond pad rows, some wire sets may include fewer wires than corresponds with the number of bond pad rows. For example, if the substrate 110 and the device 120 each include four bond pad rows, some wire sets can include four wires, some can include three, and some can include two. Further, a single wire can extend between a row of the substrate and a row of the device.

As illustrated, the assembly 100 includes six pairs of balanced wires extending between the substrate 110 and the device 120, where each of the substrate 110 and the device 120 include two rows of bond pads.

The substrate bond pads 112, the device bond pads 122, and the first and the second wires 130, 132 can each include any suitable conductive material such as, for example, copper, gold, silver, aluminum, tungsten, cobalt, nickel, or any other suitable conductive material, or combination thereof.

Figure 2:
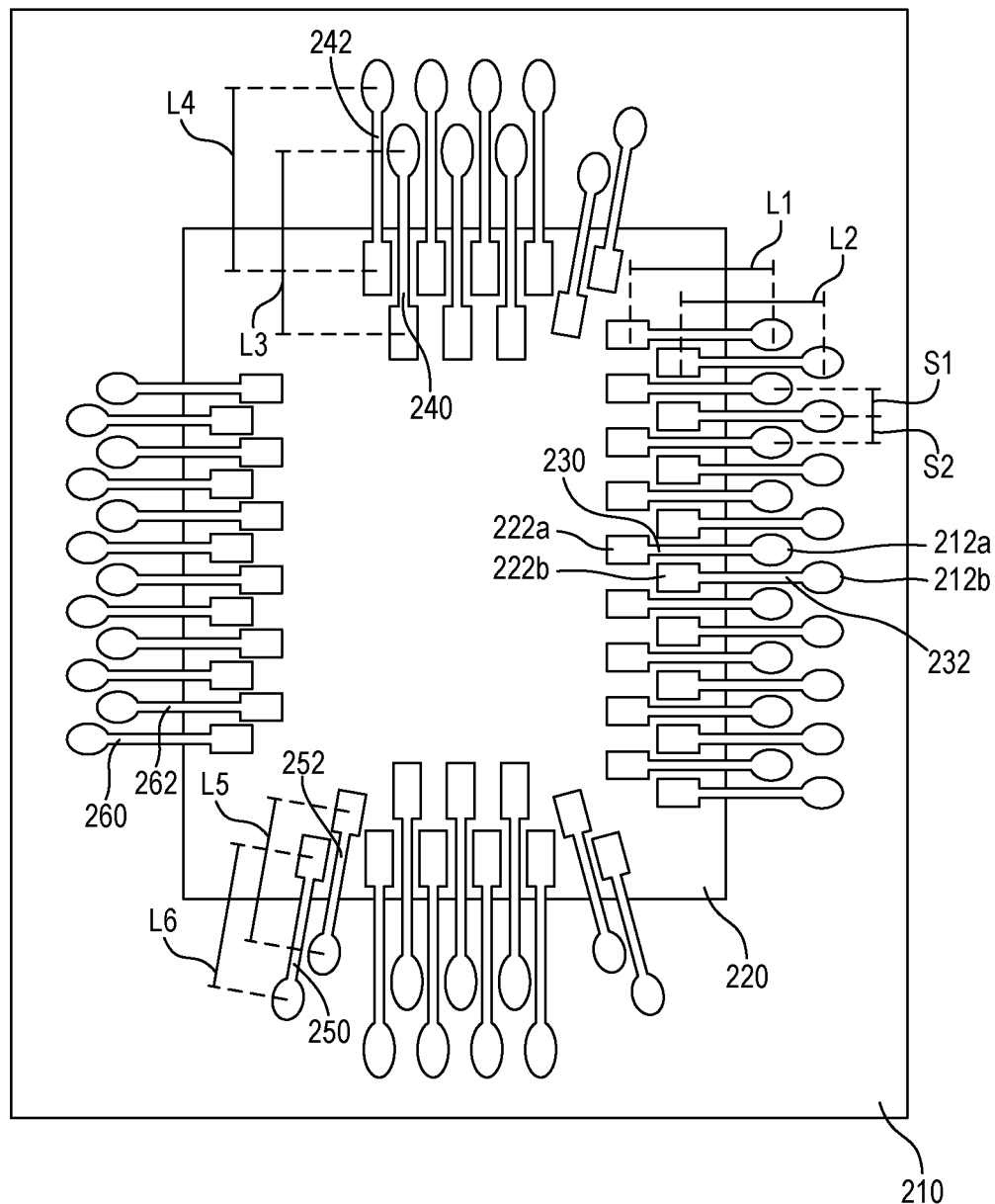
FIG. 2 is a top view, schematic diagram of a semiconductor device assembly, configured in accordance with some embodiments of the present technology.

FIG. 2 is a schematic diagram of a semiconductor device assembly 200 including multiple examples of balanced wires or traces directly electrically coupling a semiconductor device 220 to a semiconductor assembly substrate 210 and/or other devices, configured in accordance with some embodiments of the present technology. Elements of the assembly 200 can include the same and/or similar features and functions as similar elements from the assembly 100 of FIG. 1. For example, a substrate 210 can be like the substrate 110 of FIG. 1; a device 220 can be like the device 120 of FIG. 1; substrate and device bond pads 212, 222 can be like the substrate and the device bond pads 112, 122 of FIG. 1; and pairs of balanced wires 230 & 232, 240 & 242, 250 & 252, 260 & 262 can be like the pair of balanced wires 130 & 132 of FIG. 1, among other similarities.

FIG. 2 illustrates the assembly 200 with at least four examples of balanced wire pairs. These examples include:

(i) a wire pair at the right side of the device 220 with wires 230, 232 similar to the first and the second wires 130, 132 of FIG. 1; (ii) a wire pair at the top of the device 220 with extended (e.g., longer) wires 240, 242; (iii) a wire pair at the top and the bottom of the device 220 with angled (e.g., slanted, turned, rotated) wires 250, 252; and (iv) a wire pair at the left side of the device 220 with wires 260, 262 extending between bond pad rows without a gap therebetween (e.g., overlapping pad wires 260, 262), among other examples. Elements of examples (i)-(iv) can include the same and/or similar features as other examples (i)-(iv) (e.g., example (iii) can include features like example (i)). Further, the length of the wires in a pair of balanced wires (e.g., the wires 230, 232; the extended wires 240, 242; the angled wires 250, 252; and/or the overlapping pad wires 260, 262, respectively) can be the same, or substantially the same, as the other wire within the pair, or as wire within another pair (except the extended wires 240, 242).

In some embodiments, additionally or alternatively, the assembly 200 can be implemented with traces within the substrate 210. For example, one or more of the wires 230, 232; the extended wires 240, 242; the angled wires 250, 252; and/or the overlapping pad wires 260, 262 (collectively, the "assembly 200 wires 230-260") can be implemented as traces within the substrate 210. In these embodiments, the substrate 210 of FIG. 2 can include two pairs of corresponding, staggered trace bond pad rows at the top surface thereof, similar to the inner and outer substrate bond pad rows from the substrate 110 of FIG. 1. Further, the device 220 of FIG. 2 can include a pair of lower staggered bond pad rows at a lower surface thereof, similar to the inner and outer device bond pad rows from the device 120 of FIG. 1.

The staggered trace bond pad rows from the substrate 210 of FIG. 2 can include an exposed pair of staggered bond pad rows (e.g., exposed bond pad rows; substrate bond pads 212) and a covered pair of staggered bond pad rows (e.g., covered bond pad rows; similar to the illustrated device bond pads 222, but implemented on the top surface of the substrate 212). The exposed and covered bond pad rows can be laterally spaced from one another with balanced traces (e.g., as illustrated, one or more of the assembly 200 wires 230-260) within the substrate 210 and extending between, and electrically coupling, corresponding inner and outer bond pads of the exposed and covered bond pad rows.

The lower staggered bond pad rows from the device 220 can include the device bond pad rows (e.g., as illustrated) implemented on the lower surface of the device 220. The lower staggered bond pad rows from the device 220 can be configured to physically and electrically coupled with the covered bond pad rows of the substrate 210, thereby connecting the device 220 with other components of or external to the assembly 200, via the balanced traces and exposed bond pad rows of the substrate 210. Assemblies including these embodiments of the present technology can experience at least the same benefits as discussed above referencing the assembly 100 of FIG. 1. Further, the features, limitations, and/or benefits of one or more of the assembly 200 wires 230-260 as described herein can similarly refer to one or more of the features, limitations, and/or benefits of the balanced traces.

Referencing FIG. 2 and the assembly 200 wires 230-260, the wire pair at the right side of the device 220 can have the wires 230, 232 similar to the first and the second wires 130, 132 of FIG. 1. In the pair, a first wire 230 can extend from an inner substrate bond pad 212a to an outer device bond pad 222a, and a second wire 232 can extend from an outer substrate bond pad 212b to an inner device bond pad 222b.

As shown, a lateral distance L1 between corresponding structural features (e.g., an edge, a center, a bonding location of the first wire 230, etc.) of the inner substrate bond pad 212a and the outer device bond pad 222a can be the same, or substantially the same, as a lateral distance L2 between corresponding structural features of the outer substrate bond pad 212b and the inner device bond pad 222b. Further, a length of the first wire 230 can be the same, or substantially the same, as the length of the second wire 232.

A lateral distance S1 (i) between the first and the second wires 230, 232 of a bond wire pair; (ii) between adjacent inner or outer substrate bond pads 212a, 212b of a wire pair, respectively; and/or (iii) between adjacent inner or outer device bond pads 222a, 222b of a wire pair, respectively, can be between 10 μm and 200 μm, inclusive, or any specific value outside or therebetween. The lateral distance S1 between wires 230, 232, or other corresponding structures of a balance wire pair, can be the same, or substantially the same, for all balanced wire pairs (e.g., the wires 130, 132 of FIG. 1; the extended wires 240, 242; the angled wires 250, 252; and/or the overlapping pad wires 260, 262).

A lateral distance S2 (i) between the first and the second wires 230, 232 of adjacent bond wire pairs; (ii) between adjacent inner or outer substrate bond pads 212a, 212b of adjacent wire pairs, respectively; and/or (iii) between adjacent inner or outer device bond pads 222a, 222b of adjacent wire pairs, respectively, can be as small as 10 μm, or any specific value greater than 10 μm. The lateral distance S2 between adjacent balanced wire pairs, or corresponding structures of a balanced wire pairs, can be the same, or substantially the same, between all adjacent balance wire pairs. As illustrated, the assembly 200 includes nine pairs of balanced wires 230, 232. The balanced wires 230, 232 can provide at least the same benefits as the balanced wire pair (e.g., the first and the second wires 130, 132) of the FIG. 1.

The wire pair at the top of the device 220 can have the extended wires 240, 242 that are generally similar or the same as the wires 230, 232, but with extended lengths. In the pairs, a third wire 240 can extend from an inner substrate bond pad 212a to an outer device bond pad 222a, and a fourth wire 242 can extend from an outer substrate bond pad 212b to an inner device bond pad 222b. A length of the third wire 240 can be the same, or substantially the same as, the length of the fourth wire 242. For example, the third and the fourth wires 240, 242 can each have a length between 500 μm and 5000 μm inclusive, or any specific value outside this range.

As shown, a lateral distance L3 between corresponding structural features of the inner substrate bond pad 212a and the outer device bond pad 222a for the third wire 240 can be the same as a lateral distance L4 between corresponding structural features of the outer substrate bond pad 212b and the inner device bond pad 222b for the fourth wire 242. For example, the lateral distances L3 and L4 can be between 500 μm and 5000 μm, inclusive, or any specific value outside these ranges. Further, a lateral distance between the third and the fourth wires 240, 242, or between pairs of the third and the fourth wires 240, 242, can be the same as the lateral distance S1 and S2, respectively.

As illustrated, the assembly 200 includes three pairs of extended wires 240, 242, and a single extended wire. The extended wires 240, 242 can provide at least the same benefits as the balanced wire pair (e.g., the first and the second wires 130, 132) of the FIG. 1. Further, the extended wires 240, 242 can provide the additional benefit of extending over existing components on the substrate 210 surface, at least increasing design options for manufacturers regarding device 220 or other component placement.

The wire pair at the top and the bottom of the device 220 can have the angled wires 250, 252 that are generally similar or the same as the wires 230, 232, but with wires that are not perpendicular to a side of the device and/or are not parallel with other balance wire pairs of the assembly 200. For example, the angled wires 250, 252 can have an angle between a center line of the wires 250, 252 and the side of the side between 0° and 90°, non-inclusive. In the pair, a fifth wire 250 can extend from an inner substrate bond pad 212a to an outer device bond pad 222a, and a sixth wire 252 can extend from an outer substrate bond pad 212b to an inner device bond pad 222b. A length of the fifth wire 250 can be the same, or substantially the same as, the length of the sixth wire 252. Further, the length of the fifth and the sixth wires 250, 252 can be the same length as the first and the second wires 230, 232.

As shown, a lateral distance L5 between corresponding structural features of the inner substrate bond pad 212a and the outer device bond pad 222a for the fifth wire 250 can be the same as a lateral distance L6 between corresponding structural features of the outer substrate bond pad 212b and the inner device bond pad 222b for the sixth wire 252. The lateral distances L5 and L6 can be the same length as the lateral distances L1 and L2 of the first and the second wire 230, 232 pair. Further a lateral distance between the fifth and the sixth wires 250, 252, or between pairs of the fifth and the sixth wires 250, 252, can be the same as the lateral distance S1 and S2, respectively, corresponding with the first and the second wires 230, 232.

As illustrated, the assembly 200 includes three pairs of angled wires 250, 252; one at the top of the device 220 and two at the bottom of the device 220. The centerlines of the angled wires 250, 252 are angled 70° or −70° from the respective sides of the device 220. The angled wires 250, 252 can provide at least the same benefits as the balanced wire pair (e.g., the first and the second wires 130, 132) of the FIG. 1. Further, the angled wires 250, 252 can provide the additional benefit of flexibility in bond pad placement on the substrate 210 surface, at least increasing design options for manufacturers regarding device 220 or other component placement.

The wire pairs at the left of the device 220 can have the overlapping pad wires 260, 262. In the pairs, a seventh wire 260 can extend from an inner substrate bond pad 212a to an outer device bond pad 222a, and an eighth wire 262 can extend from an outer substrate bond pad 212b to an inner device bond pad 222b. A length of the seventh wire 260 can be the same, or substantially the same as, the length of the eighth wire 262. Further, the length of the seventh and the eighth wires 260, 262 can be the same length as the first and the second wires 230, 232.

As illustrated, no gap (e.g., spacing) exists between the outer edges of the inner substrate bond pads 212a and the inner edges of the outer substrate bond pads 212b. Similarly, no gap exists between the inner edges of the outer device bond pads 222a and the outer edges of the inner device bond pads 222b. That is, along the length of the inner and outer rows of bond pads, the bond pads 212, 212 overlap. For example, along the length of the first and the second bond pad rows of the substrate 210, a straight line can be drawn passing through the body of each of the substrate bond pads 212. Similarly, a straight line can be drawn passing through the body of each of the device bond pads 222.

A lateral distance between corresponding structural features of the inner substrate bond pad 212a and the outer device bond pad 222a for the seventh wire 260, and a lateral distance between corresponding structural features of the outer substrate bond pad 212b and the inner device bond pad 222b for the eighth wire 262 can be the same as the lateral distances L1 and L2 of the first and the second wires 230, 232. Further, a lateral distance between the seventh and the eighth wires 260, 262, or between pairs of the seventh and the eighth wires 260, 262, can be the same as the lateral distance S1 and S2, respectively, corresponding with the first and the second wires 230, 232.

As illustrated, the assembly 200 includes six pairs of overlapping pad wires 260, 262. The overlapping pad wires 260, 262 can provide at least the same benefits as the balanced wire pair (e.g., the first and the second wires 130, 132) of the FIG. 1. Further, the overlapping pad wires 260, 262 can provide the additional benefit dedicating less substrate 210 or device 220 surface area to the bond pads, at least increasing design options for manufacturers regarding device 220 or other component placement.

FIG. 3 is a flow diagram illustrating a process 300 for producing a semiconductor device assembly, in accordance with some embodiments of the present technology. For example, the process 300 can be used to produce at least the assembly 100 of FIG. 1 and the assembly 200 of FIG. 2. The operations of process 300 are intended for illustrative purposes and are non-limiting. In some embodiments, for example, the process 300 can be accomplished with one or more additional operations not described, without one or more of the operations described, or with operations described and/or not described in an alternative order.

As shown in FIG. 3, the process 300 can include: providing a substrate having a top surface at which are disposed a first and a second bond pad (process portion 302); coupling a lower surface of a semiconductor die to the top surface of the substrate, the semiconductor die including an upper surface, and further including a third and a fourth bond pad at the upper surface (process portion 304); forming a first wire extending from the first bond pad to the third bond pad (process portion 306); and forming a second wire extending from the second bond pad to the fourth bond pad, the second wire having a length substantially the same as a length of the first wire (process portion 308).

In some embodiments, one or more of the process portions 304-308 can be performed in a single facility. For example, the substrate and the semiconductor die preparation and fabrication (e.g., providing), and coupling can be performed by a single entity or at a single facility; and forming of the first and the second wires can be performed in the same facility. In some embodiments, one or more of the process portions 304-308 can be performed at multiple facilities. For example, the substrate and the semiconductor die preparation and fabrication (e.g., providing), and coupling can be performed by a first entity or at a first facility; and forming of the first and the second wires can be performed by a second entity or at a second facility, among other shared processes arrangements.

Providing the substrate having the top surface at which are disposed the first and the second bond pad (process portion 302) can include forming the substrate, with the bond pads therein, using one or more of a suitable additive manufacturing process including, for example, sputtering, physical vapor deposition (PVD), electroplating, lithography, or any other similar process. Forming, forming can also include masking (e.g., dielectric, photoresist material) and/or etching processes intermixed with the additive process(es).

Coupling the lower surface of the semiconductor die to the top surface of the substrate (process portion 304) can include first forming the semiconductor die, and then bonding, adhering, affixing, or otherwise attaching the semiconductor die to the substrate. Forming the semiconductor die, with the bond pads therein, can include using one or more of a suitable additive manufacturing process including, for example, sputtering, PVD, electroplating, lithography, or any other similar process. Forming can also include masking (e.g., dielectric, photoresist material) and/or etching processes intermixed with the additive process(es). Coupling (e.g., bonding, adhering, affixing, or otherwise attaching) can include any suitable mechanical coupling between the lower surface of the semiconductor die and the top surface of the substrate. For example, coupling can include an adhesive, surface bonding, or any other similar suitable process.

Forming the first wire extending from the first bond pad to the third bond pad (process portion 306) and forming the second wire extending from the second bond pad to the fourth bond pad (process portion 308) can each include forming, consecutively or simultaneously, a wire from the first and the second bond pad to the third and the fourth bond pad, respectively. Forming the wires can include any suitable wire forming and bonding process. In some embodiments, the wires may instead be formed from the third and the fourth bond pads to the first and the second bond pads, respectively; or the wires may be formed in a zig-zag pattern (e.g., the first wire from the first to the third bond pad, then the second wire from the fourth to the second bond pad).

Figure 4:
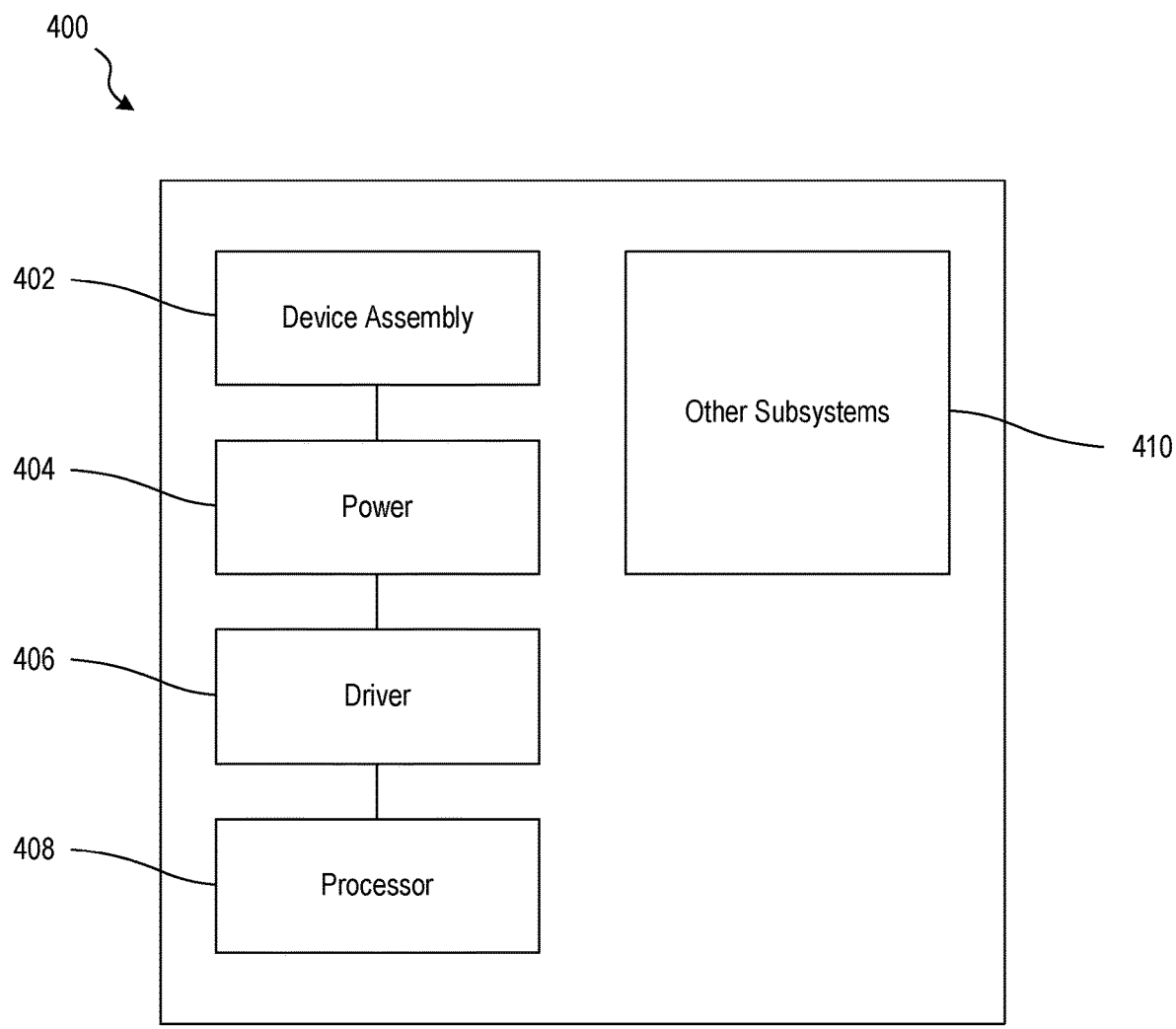
FIG. 4 is a schematic diagram illustrating a semiconductor device assembly incorporating the present technology, configured in accordance with some embodiments of the present technology.

Any one of the semiconductor devices, dies, and/or assemblies described above with reference to FIGS. 1-3 can be incorporated into any of a myriad of larger and/or more complex systems, a representative example of which is system 400 shown schematically in FIG. 4. The system 400 can include a semiconductor device assembly 402 (e.g., the assembly 100 of FIG. 1), a power source 404, a driver 406, a processor 408, and/or other subsystems or components 410. The semiconductor device assembly 402 can include features generally similar to those of the semiconductor devices and assemblies described above with reference to FIGS. 1-3. The resulting system 400 can perform any of a wide variety of functions, such as memory storage, data processing, or other suitable functions. Accordingly, representative systems 400 can include, without limitation, handheld devices (e.g., mobile phones, tablets, digital readers, and digital audio players), computers, vehicles, appliances, and other products. Components of the system 400 may be housed in a single unit or distributed over multiple, interconnected units (e.g., through a communications network). The components of the system 400 can also include remote devices and any of a wide variety of computer readable media.

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "and/or" as used in a list of items (for example, a list of items prefaced by a phrase such as "at least one of" or "one or more of") indicates an inclusive list such that, for example, a list of at least one of A, B, and/or C means: A or B or C; or AB or AC or BC; or ABC (i.e., A and B and C). As used herein, the terms "vertical," "lateral," "upper," "lower," "above," and "below" can refer to relative directions or positions of features in the semiconductor devices in view of the orientation shown in the figures. For example, "upper" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. It should be noted that the methods described above describe possible implementations, and that the operations and the steps may be rearranged or otherwise modified and that other implementations are possible. Furthermore, embodiments from two or more of the methods may be combined.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
    a substrate having a top surface at which are disposed a first and a second bond pad;
    a semiconductor die having a lower surface coupled to the top surface of the substrate, an upper surface, and a side surface perpendicular to the upper and the lower surfaces, the semiconductor die including a third and a fourth bond pad at the upper surface,
    wherein the first bond pad is a first distance from a first closest point of the side surface to the first bond pad and the second bond pad is a second distance from a second closest point of the side surface to the second bond pad, different from the first distance, wherein the third bond pad is a third distance from a third closest point of the side surface to the third bond pad and the fourth bond pad is a fourth distance from a fourth closest point of the side surface to the fourth bond pad, different from the third distance, and wherein a sum of the first distance and the third distance is substantially the same as the sum of the second distance and the fourth distance;

a first wire extending from the first bond pad to the third bond pad; and a second wire extending from the second bond pad to the fourth bond pad.

2. The semiconductor device assembly of claim 1, wherein the semiconductor die further has a second side surface and a fifth and a sixth bond pad at the upper surface, wherein the substrate further includes a seventh and an eighth bond pad at the top surface, and:

wherein the fifth bond pad is a fifth distance from a fifth closest point of the second side surface to the fifth bond pad and the sixth bond pad is a sixth distance from a sixth closest point of the second side surface to the sixth bond pad, different from the fifth distance, wherein the seventh bond pad is a seventh distance from the second side surface and the eighth bond pad is an eighth distance from the second side surface, different from the seventh distance, and wherein a sum of the fifth distance and the seventh distance is substantially the same as the sum of the sixth distance and the eighth distance.

3. The semiconductor device assembly of claim 2, wherein a third wire extends from the fifth bond pad to the seventh bond pad, and a fourth wire extends from the sixth bond pad to the eighth bond pad.

4. The semiconductor device assembly of claim 3, wherein a total length of the third wire is substantially the same as a total length of the fourth wire.

5. The semiconductor device assembly of claim 1, wherein a total length of the first wire is the same as a total length of the second wire.

6. The semiconductor device assembly of claim 1, wherein the first and the second bond pads are separated by a first lateral spacing distance, and wherein the third and the fourth bond pads are also separated by the first lateral spacing distance.

7. The semiconductor device assembly of claim 1, wherein a centerline of the first wire is not perpendicular with the side surface of the semiconductor die.

8. The semiconductor device assembly of claim 1 further including a gap between an inner edge of the first bond pad and an outer edge of the second bond pad, and between an inner edge of the fourth bond pad and an outer edge of the third bond pad.

9. The semiconductor device assembly of claim 1, wherein the first and the second wires comprise gold.

10. A semiconductor device assembly, comprising:

a substrate having a top surface at which are disposed a first and a second bond pad;

a semiconductor die having a lower surface coupled to the top surface of the substrate, an upper surface, and a side surface perpendicular to the upper and the lower surfaces, the semiconductor die including a third and a fourth bond pad at the upper surface, wherein the first bond pad is closer to the side surface than the second bond pad, and wherein the third bond pad is further from the side surface than the fourth bond pad;

a first wire extending from the first bond pad to the third bond pad; and a second wire extending from the second bond pad to the fourth bond pad, wherein a total length of the first wire is substantially the same as a total length of the second wire, wherein the substrate further includes a fifth bond pad at the top surface, wherein the semiconductor die has a sixth bond pad at the upper surface, and a third wire extends from the fifth bond pad to the sixth bond pad and has a total length that is substantially the same as the total length of the second wire, and wherein the fifth bond pad is substantially the same distance from a fifth closest point of the side surface to the fifth bond pad as the first bond pad is from a first closest point of the side surface to the first bond pad, and wherein the sixth bond pad is substantially the same distance from a sixth closest point of the side surface to the sixth bond pad as the third bond pad is from a third closest point of the side surface to the third bond pad.

11. The semiconductor device assembly of claim 10, wherein the sum of a distance between the first bond pad and a first closest point of the side surface to the first bond pad and the distance between the third bond pad and a third closest point of the sides surface to the third bond pad is substantially the same as the sum of the distance between the second bond pad and a second closest point of the side surface to the second bond pad and the distance between the fourth bond pad and a fourth closest point of the side surface to the fourth bond pad.

12. The semiconductor device assembly of claim 10, wherein the first and the second bond pads are separated by a first lateral spacing distance, and wherein the third and the fourth bond pads are also separated by the first lateral spacing distance.

13. The semiconductor device assembly of claim 10, wherein a centerline of the first wire is not perpendicular with the side surface of the semiconductor die.

14. The semiconductor device assembly of claim 10 further including a gap between an inner edge of the first bond pad and an outer edge of the second bond pad, and between an inner edge of the fourth bond pad and an outer edge of the third bond pad.

15. The semiconductor device assembly of claim 10, wherein the first and the second wires comprise gold.

16. A semiconductor device assembly, comprising:

a substrate having a top surface at which are disposed a first and a second bond pad;

a semiconductor die having a lower surface coupled to the top surface of the substrate, an upper surface, and a side surface perpendicular to the upper and the lower surfaces, the semiconductor die including a third and a fourth bond pad at the upper surface, wherein the first bond pad is closer to the side surface than the second bond pad, and wherein the third bond pad is further from the side surface than the fourth bond pad;

a first wire extending from the first bond pad to the third bond pad; and a second wire extending from the second bond pad to the fourth bond pad, wherein a total length of the first wire is substantially the same as a total length of the second wire, wherein the substrate further includes a fifth bond pad at the top surface, wherein the semiconductor die has a sixth bond pad at the upper surface, and a third wire extends from the fifth bond pad to the sixth bond pad and has a total length that is substantially the same as the total length of the second wire, and wherein the fifth bond pad is a distance from a fifth closest point of the side surface to the fifth bond pad different than the distance between corresponding first and second closest points of the side surface and either the first or the second bond pads, and wherein the sixth bond pad is a distance from a sixth closest point of the side surface to the sixth bond pad different than the distance between corresponding third and fourth closest points of the side surface and either the third or the fourth bond pads.

17. The semiconductor device assembly of claim 16, wherein the first and the second bond pads are separated by a first lateral spacing distance, and wherein the third and the fourth bond pads are also separated by the first lateral spacing distance.

18. The semiconductor device assembly of claim 16, wherein a centerline of the first wire is not perpendicular with the side surface of the semiconductor die.

19. The semiconductor device assembly of claim 16 further including a gap between an inner edge of the first bond pad and an outer edge of the second bond pad, and between an inner edge of the fourth bond pad and an outer edge of the third bond pad.

20. A method of manufacturing a semiconductor device assembly, comprising:

providing a substrate having a top surface at which are disposed a first and a second bond pad;

coupling a lower surface of a semiconductor die to the top surface of the substrate, the semiconductor die including an upper surface and a side surface perpendicular to the upper and the lower surfaces, and further including a third and a fourth bond pad at the upper surface, wherein the first bond pad is closer to the side surface than the second bond pad, and wherein the third bond pad is further from the side surface than the fourth bond pad;

forming a first wire extending from the first bond pad to the third bond pad; and forming a second wire extending from the second bond pad to the fourth bond pad, and having a total length substantially the same as a total length of the first wire, wherein coupling the semiconductor die to the substrate further includes aligning the semiconductor die with the substrate such that the sum of the distance between the first bond pad and a first closest point of the side surface to the first bond pad and the distance between the third bond pad and the a third closest point of the side surface to the third bond pad is substantially the same as the sum of the distance between the second bond pad and a second closest point of the side surface to the second bond pad and the distance between the fourth bond pad and a fourth closest point of the side surface to the fourth bond pad.

* * * * *